(12) United States Patent
Wang et al.

(10) Patent No.: US 11,444,633 B2
(45) Date of Patent: Sep. 13, 2022

(54) NEAR ZERO POWER FULLY INTEGRATED DIGITAL CONVERSION, SENSORS AND SENSING METHODS

(71) Applicant: The Regents of the University of California, Oakland, CA (US)

(72) Inventors: Hui Wang, San Diego, CA (US); Patrick Mercier, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/285,289

(22) PCT Filed: Oct. 14, 2019

(86) PCT No.: PCT/US2019/056055
§ 371 (c)(1),
(2) Date: Apr. 14, 2021

(87) PCT Pub. No.: WO2020/081423
PCT Pub. Date: Apr. 23, 2020

(65) Prior Publication Data
US 2021/0242877 A1     Aug. 5, 2021

Related U.S. Application Data

(60) Provisional application No. 62/745,743, filed on Oct. 15, 2018.

(51) Int. Cl.
*H03M 1/38*     (2006.01)
*G01K 7/00*     (2006.01)
*H03M 1/56*     (2006.01)

(52) U.S. Cl.
CPC ............... *H03M 1/38* (2013.01); *G01K 7/00* (2013.01); *H03M 1/56* (2013.01)

(58) Field of Classification Search
CPC ................................ H03M 1/38; H03M 1/56
(Continued)

(56) References Cited

U.S. PATENT DOCUMENTS

2006/0220941 A1   10/2006   Lee
2013/0009800 A1    1/2013   Yang et al.
(Continued)

OTHER PUBLICATIONS

Wang et al., "Near-Zero-Power Temperature Sensing via Tunneling Currents Through Complementary Metal-Oxide-Semiconductor Transistors", Scientific Reports, 2017, pp. 1-7, vol. 7, No. 4427, Nature.
(Continued)

*Primary Examiner* — Peguy Jean Pierre
(74) *Attorney, Agent, or Firm* — Greer, Burns & Crain, Ltd.; Steven P. Fallon

(57) ABSTRACT

A charging to digital converter sensor in a CMOS integrated circuit digitizes a sensed property by comparing charging time between two paths and adjusting the charging rate of one of the two paths by increasing or decreasing the amount of capacitance in that path, until both of the two paths have the same charging time to reach respective constant with sensed property and proportional with sensed property reference voltages or currents. Sub nanowatt operation is achieved with preferred circuits. A method directly digitizes, on-chip, a charging time comparison of two ramp voltages that are compared to respective constant with sensed property and proportional with sensed property reference voltages or currents.

11 Claims, 7 Drawing Sheets

(58) Field of Classification Search
USPC .................................. 341/155, 161, 159, 156
See application file for complete search history.

(56) References Cited

U.S. PATENT DOCUMENTS

| | | | |
|---|---|---|---|
| 2013/0062503 A1 | 3/2013 | Saito et al. | |
| 2013/0271308 A1 | 10/2013 | Osaki et al. | |
| 2020/0355732 A1* | 11/2020 | Koch | G01R 27/26 |

OTHER PUBLICATIONS

Wang et al., "A 113 pW Fully Integrated CMOS Temperature Sensor Operating at 0.5 V", 2017 IEEE Sensors, 2017, pp. 1-3, IEEE.
Jeong et al., "A Fully-Integrated 71 nW CMOS Temperature Sensor for Low Power Wireless Sensor Nodes", IEEE Journal of Solid-State Circuits, 2014, pp. 1682-1693, vol. 49, No. 8, IEEE.
Mercier et al., "Energy extraction from the biologic battery in the inner ear", Nature Biotechnology, 2012, pp. 1240-1244, vol. 30, No. 12, Nature America, Inc.
Sackmann et al., "The present and future role of microfluidics in biomedical research", Nature, 2014, pp. 181-189, vol. 507, Macmillan Publishers Limited.
Gough et al., "Function of an Implanted Tissue Glucose Sensor for More than 1 Year in Animals", Science Translational Medicine, 2010, pp. 1-8, vol. 2, No. 42, American Association for the Advancement of Science, Nashington, DC.
Chin et al., "Microfluidics-based diagnostics of infectious diseases in the developing world", Nature Medicine, 2011, pp. 1015-1020, vol. 17, No. 8, Nature.
Hagleitner et al., "Smart single-chip gas sensor microsystem", Nature, 2001, pp. 293-296, vol. 414, Macmillan Magazines Ltd.
Pertijs et al., "A CMOS Smart Temperature Sensor With a 3σ Inaccuracy of ±0.1° C From -55° C to 125° C", IEEE Journal of Solid-State Circuits, 2005, pp. 2805-2815, vol. 40, No. 12, IEEE.
Sebastiano et al., "A 1.2-V 10-µW NPN-Based Temperature Sensor in 65-nm CMOS With an Inaccuracy of 0.2° C (3σ) From -70° C to 125° C", IEEE Journal of Solid-State Circuits, 2010, pp. 2591-2601, vol. 45, No. 12, IEEE.
Souri et al., "A CMOS Temperature Sensor With a Voltage-Calibrated Inaccuracy of ±0.15° C (3σ) From -55° C to 125° C", IEEE Journal of Solid-State Circuits, 2013, pp. 292-301, vol. 48, No. 1, IEEE.

Hirose et al., "A Nano-Ampere Current Reference Circuit and its Temperature Dependence Control by using Temperature Characteristics of Carrier Mobilities", 2010 Proceedings of ESSCIRC, 2010, pp. 114-117, IEEE.
Lee et al., "A 1.4-µW 24.9-ppm/° C Current Reference With Process-Insensitive Temperature Compensation in 0.18 µm CMOS", IEEE Journal of Solid-State Circuits, 2012, pp. 2527-2533, vol. 47, No. 10, IEEE.
Ueno et al., "A 300 nW, 15 ppm/° C, 20 ppm/V CMOS Voltage Reference Circuit Consisting of Subthreshold MOSFETs", IEEE Journal of Solid-State Circuits, 2009, pp. 2047-2054, vol. 44, No. 7, IEEE.
Souri et al., "A 0.85V 600nW All-CMOS Temperature Sensor with an Inaccuracy of ±0.4° C (3σ) from 40 to 125° C", 2014 IEEE International Solid-State Circuits Conference, 2014, pp. 222-224, IEEE.
Yang et al., "A 0.6nJ -0.22/+0.19° C Inaccuracy Temperature Sensor Using Exponential Subthreshold Oscillation Dependence", 2017 IEEE International Solid-State Circuits Conference, 2017, pp. 160-162, IEEE.
Camacho-Galeano et al., "A 2-nW 1.1-V Self-Biased Current Reference in CMOS Technology", IEEE Transactions on Circuits and Systems—II: Express Briefs, 2005, pp. 61-65, vol. 52, No. 2, IEEE.
Ueno et al., "A 1-µW 600-ppm/° C Current Reference Circuit Consisting of Subthreshold CMOS Circuits", IEEE Transactions on Circuits and Systems—II: Express Briefs, pp. 681-685, vol. 57, No. 9, IEEE.
Huang et al., "A CMOS Sub-1-V NanoPower Current and Voltage Reference with Leakage Compensation", Proceedings of 2010 IEEE International Symposium on Circuits and Systems, 2010, pp. 4069-4072, IEEE.
Azcona et al., "Precision CMOS Current Reference with Process and Temperature Compensation", 2014 IEEE International Symposium on Circuits and Systems, 2014, pp. 910-913, IEEE.
Wang et al., "A 0.45-V, 14.6-nW CMOS Subthreshold Voltage Reference With No Resistors and No BJTs", IEEE Transactions on Circuits and Systems—II: Express Briefs, 2015, pp. 621-625, vol. 62, No. 7, IEEE.
Seok et al., "A Portable 2-Transistor Picowatt Temperature-Compensated Voltage Reference Operating at 0.5 V", IEEE Journal of Solid-State Circuits, 2012, pp. 2534-2545, vol. 47, No. 10, IEEE.
International Search Report and Written Opinion from the corresponding International Patent Application No. PCT/US2019/056055, dated Dec. 18, 2019.

* cited by examiner

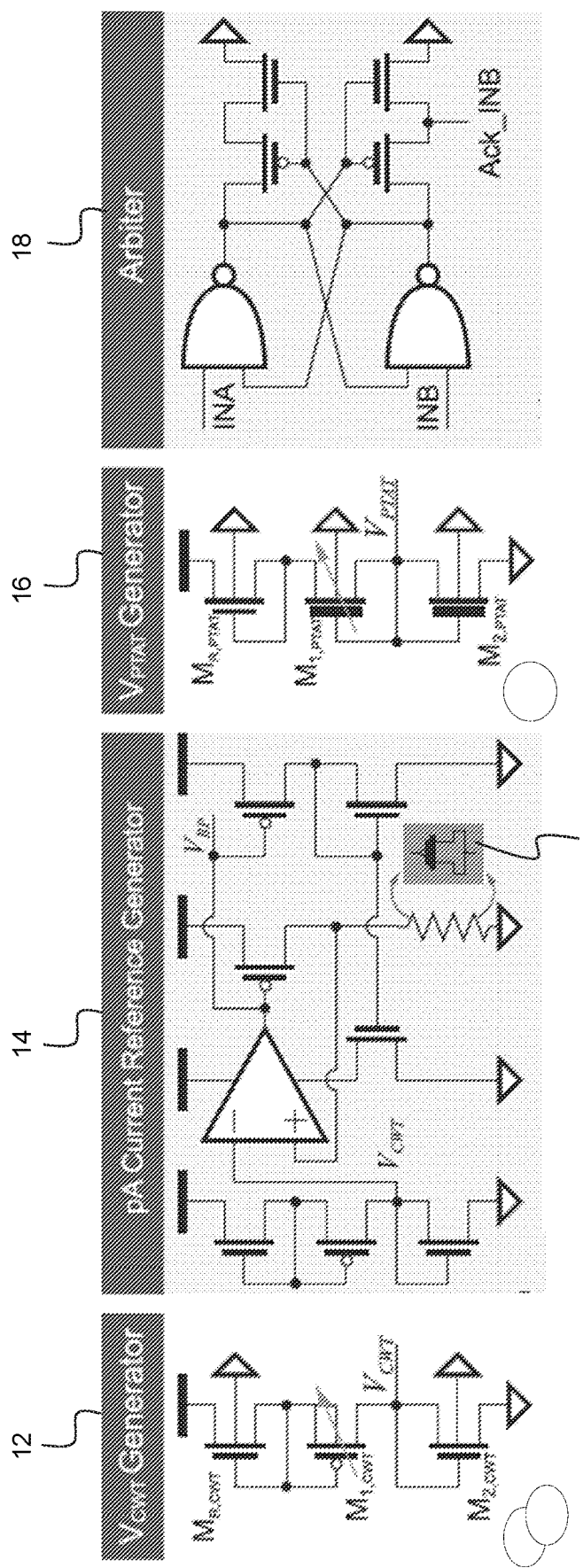

NEAR ZERO POWER FULLY INTEGRATED DIGITAL CONVERSION, SENSORS AND SENSING METHODS

PRIORITY CLAIM AND REFERENCE TO RELATED APPLICATION

The application claims priority under 35 U.S.C. § 119 and all applicable statutes and treaties from prior U.S. provisional application Ser. No. 62/745,743 which was filed Oct. 15, 2019.

FIELD

A field of the invention is low power charging to digital conversion, sensors, e.g., temperature sensors, pressure sensing, humidity sensing, strain sensing, etc. and sensing methods. Other fields of the invention include voltage reference generation. Example applications of the invention include circuits used in wireless systems, therapeutic devices, diagnostic devices, sensor devices, wearable devices, and research reagent applications.

BACKGROUND

Temperature measurement is important in applications including environmental monitoring, wearable biomedical devices, smart homes, and industrial internet-of-things equipment. Typical temperature sensing devices are designed to be small and/or unobtrusive. There is only a very small volume provided for a battery or energy harvesting source. Overall power available for such systems very limited to near zero power in order to support long system lifetime in a wide variety of applications. See, e.g., Mercier, P. P., Lysaght, A. C., Bandyopadhyay, S., Chandrakasan, A. P. & Stankovic, K. M., "Energy extraction from the biologic battery in the inner ear," *Nat. Biotechnol.* 30, 1240-1243 (2012); Sackmann, E. K., Fulton, A. L. & Beebe, D. J., "The present and future role of microfluidics in biomedical research," *Nature* 507, 181-189 (2014); Gough, D. A., Kumosa, L. S., Routh, T. L., Lin, J. T. & Lucisano, J. Y., "Function of an Implanted Tissue Glucose Sensor for More than 1 Year in Animals," *Sci. Transl. Med.* 2, 42ra53 (2010); Chin, C. D. et al., "Microfluidics-based diagnostics of infectious diseases in the developing world," *Nat. Med.* 17, 1015-1019 (2011); Hagleitner, C. et al,". Smart single-chip gas sensor microsystem," *Nature* 414, 293-296 (2001).

Accurate temperature sensors with such near zero power requirements are difficult to realize in practice. One prior approach involves measuring the temperature characteristics of bipolar junction transistors (BJT) integrated on silicon microchips. In such cases, temperature is transduced by comparing the proportional to absolute temperature (PTAT) characteristic of the difference between two base-emitter voltages of a vertical NPN BJT ($\Delta V_{BE}$) and the complementary to absolute temperature (CTAT) characteristic of the base-emitter voltage ($V_{BE}$), with a co-integrated constant with temperature (CWT) voltage reference. See, Pertijs, M. A. P., Makinwa, K. A. A. & Huijsing, J. H., "A CMOS smart temperature sensor with a 3σ inaccuracy of ±0.1° C. from −55° C. to 125° C.," *IEEE J. Solid-State Circuits* 40, 2805-2815 (2005); Sebastiano, F. et al. A 1.2-V 10-μW NPN-Based Temperature Sensor in 65-nm CMOS With an Inaccuracy of 0.2° C. (3σ) from −70° C. to 125° C. *IEEE J. Solid-State Circuits* 45, 2591-2601 (2010); Souri, K., Chae, Y. & Makinwa, K. A. A., "A CMOS Temperature Sensor with a Voltage-Calibrated Inaccuracy of ±0.15° C. (3σ) From −55° C. to 125° C. *IEEE," J. Solid-State Circuits* 48, 292-301 (2013). However, biasing BJTs in the forward-active region with sufficiently low noise properties usually demands currents in the nA-μA range that, coupled with supply voltages on the order of a few volts and the power overhead of biases, analog-to-digital conversion, and control, still exceeds the power demands of ultra-small sensing nodes.

Others have proposed further reductions in power consumption via a number of techniques, including exploiting the temperature-dependency of electron/hole mobility, threshold voltage, and drain currents of MOSFETs. MOSFETs can be fabricated to have different temperature dependencies, which provides the opportunity to sense temperature via techniques analagous to the BJT techniques discussed above. See, Hirose, T., Osaki, Y., Kuroki, N. & Numa, M., "A nano-ampere current reference circuit and its temperature dependence control by using temperature characteristics of carrier mobilities," 2010 *Proceedings of European Solid-State Circuits Conference* 114-117; doi: 10.1109/ESSCIRC.2010.5619819 (2010); Lee, J. & Cho, S. A, "1.4-μW 24.9-ppm/° C. Current Reference with Process-Insensitive Temperature Compensation in 0.18-μm CMOS" *IEEE J. Solid-State Circuits* 47, 2527-2533 (2012); Ueno, K., Hirose, T., Asai, T. & Amemiya, Y. A, "300 nW, 15 ppm/° C., 20 ppm/V CMOS Voltage Reference Circuit Consisting of Subthreshold MOSFETs," *IEEE J. Solid-State Circuits* 44, 2047-2054 (2009). One approach that borrows from the strategy used with BJTs involves connecting the gate, bulk and drain of a p-channel MOSFET together, to make the characteristic of the drain current with respect to the gate voltage approximate a pn-junction and thus detect temperature in a similar way to conventional BJT-based transducers. See, Souri, K., Chae, Y., Thus, F. & Makinwa, K., "12.7 A 0.85V 600 nW all-CMOS temperature sensor with an inaccuracy of ±0.4° C. (3σ) from −40 to 125° C.," 2014 *IEEE International Solid-State Circuits Conference* 222-223; doi: 10.1109/ISSCC.2014.6757409 (2014). Temperature-encoded analog signals (currents or voltages) can then be digitized by voltage-, current-, frequency-, or time-to-digital conversion. However, all prior-art MOSFET-based techniques still require at least tens of nW of power, and often require external CWT (constant with temperature) frequency sources for digitization that are not included in the quoted power number. Jeong, S. et al., "A Fully-Integrated 71 nW CMOS Temperature Sensor for Low Power Wireless Sensor Nodes,". *IEEE J. Solid-State Circuits* 49, 1682-1693 (2014); Yang, K. et al., "A 0.6 nJ-0.22/+0.19° C. inaccuracy temperature sensor using exponential subthreshold oscillation dependence," 2017 *IEEE International Solid-State Circuits Conference* 160-161; doi: 10.1109/ISSCC.2017.7870310 (2017).

Such MOSFET based sensing represents the state-of-the art approach. To the knowledge of the inventors, there are thus no current temperature sensing techniques that achieve the sub-nW power consumption necessary to enable next-generation near-zero-power sensing nodes.

Temperature sensor systems can leverage current reference circuits. A common fully-integrated current reference is based on a ß multiplier. See, e.g., E. Camacho-Galeano et al., "A 2-nW 1.1-V self-biased current reference in CMOS technology," IEEE Transactions on Circuits and Systems II: Express Briefs, vol. 52, no. 2, pp. 61-65, (February 2005), which uses self-cascode MOSFETs (SCMs). Another approach exploits the different temperature characteristics of different carrier mobility to achieve nW power consumption and compact design, which comes, however, at the price of a high temperature coefficient. T. Hirose et al., "A nano-ampere current reference circuit and its temperature dependence control by using temperature characteristics of carrier mobilities," in 2010 Proceedings of ESSCIRC, pp. 114-117 (September 2010). An improved temperature coefficient is obtained by employing a modified multiplier that uses a MOS resistor. See, K. Ueno et al., "A 1-W 600-ppm/C Current Reference Circuit Consisting of Subthreshold CMOS Circuits," IEEE Transactions on Circuits and Systems II: Express Briefs, vol. 57, no. 9, pp. 681-685, (September 2010). However, the power consumption in that approach is still on the order of µW. Temperature coefficients on the order of 100 ppm/° C. are achieved by employing leakage compensation [Z. Huang et al., "A CMOS Sub-1-V nanopower current and voltage reference with leakage compensation," Proceedings of 2010 IEEE International Symposium on Circuits and Systems, pp. 4069-4072 (May 2010)] or by employing calibration [C. Azcona et al., "Precision CMOS current reference with process and temperature compensation," in 2014 IEEE International Symposium on Circuits and Systems (ISCAS), pp. 910-913 (June 2014)]. While leakage compensation and calibration can reduce power consumption to the desired nW level, typical circuits compensated in those ways can still exceed the power budget of near zero-power wireless platforms. In addition, the conventional current reference circuits require start-up circuits to prevent them from being trapped in the zero-bias condition, adding area and standby power overhead.

Another type of current reference circuit employs a reference voltage and a resistor. See, J. Lee and S. Cho, "A 1.4-W 24.9-ppm/C Current Reference with Process-Insensitive Temperature Compensation in 0.18-µm CMOS," IEEE Journal of Solid-State Circuits, vol. 47, no. 10, pp. 2527-2533, (October 2012). This circuit was reported to achieve a temperature coefficient as low as 24.9 ppm/° C., but had high power consumption at the µW-level power. Another circuit that used a 2T voltage reference was reported to achieve pW power consumption, but at the expense of a significantly higher 780 ppm/° C. temperature sensitivity coefficient. Such prior conventional voltage reference based current generation circuits provide a trade-off between achieving either pW level power consumption or a suitable temperature coefficient.

Conventionally, temperature- and supply-stabilized voltages are generated via bandgap voltage reference generators (VRGs). However, the lowest reported power of bandgap VRGs is tens of nW, which is too large for near-zero-power wireless application. See, Y. Wang et al., "A 0.45-V, 14.6-nW CMOS Subthreshold Voltage Reference with No Resistors and No BJTs," IEEE Transactions on Circuits and Systems II: Express Briefs, vol. 62, no. 7, pp. 621-625, (July 20150. Modification of such circuits with bandgap VRGs to achieve pA-level reference current would require resistors that are prohibitively large for a practical current generator.

Since bandgap VRGs are not suitable for sub nW applications, others have proposed 2T VRGs that consume pW-level power by exploiting the opposing temperature properties of native and high-Vth transistors. See, M. Seok et al., "A Portable 2-Transistor Picowatt Temperature-Compensated Voltage Reference Operating at 0.5 V," IEEE Journal of Solid-State Circuits, vol. 47, no. 10, pp. 2534-2545, (October 2012). However, not all CMOS technologies support native devices, limiting the availability of this approach in certain processes.

Mercier et al. PCT Publication WO2018217754 entitled Near Zero Power Charging Digital Converter, Sensors and Sensing Methods provides state-of-the-art circuits and methods that performing sensing, as well as voltage reference and current reference generation. The circuits leverage current-based, capacitive charging time-to-digital feedback structures. The current-based approach limits accuracy because of channel length modulation and current leakage. Power consumption of the current-based approach is 113 pW. The converter utilized 2T CWT and PTAT VRGs to generate CWT and PTAT currents that were employed to charge a fixed capacitance and a binary-weighted capacitive digital-to-analog converter (DAC), respectively; temperature was then digitized via a linear-search feedback loop that adjusted the capacitive DAC until the CWT and PTAT charging times were equalized. Going from CWT and PTAT voltages to currents can introduce undesired temperature-dependent non linearities, limiting the inaccuracy of the design to ±1.93° C. after three-point calibration. Additionally, the linear search algorithm required an average of 4.8 s to reach its resolution specification, which is acceptable in some, though not all, IoT applications. This paper proposes a sub 1 V and sub-nW temperature-to-digital converter that improves both accuracy and conversion time over the state of the art. The design consideration and circuit implementation are described in this section, along with a detailed analysis of the system linearity.

SUMMARY OF THE INVENTION

A preferred embodiment provides a charging to digital converter sensor in a CMOS integrated circuit. A voltage or current reference generator generates a first reference voltage or current that is constant with respect to a sensed property. A voltage or current reference generator generates a second reference voltage or current that varies with respect to the sensed property. Two paths including on-chip capacitors charged with a sub nanowatt current reference such that a first ramp voltage or current is generated in one of the two paths and a second ramp voltage or current is generated in a second of the two paths. The first ramp voltage or current is compared to the first reference voltage or current and the second ramp voltage or current is compared to the second reference voltage or current. A digitizer digitizes the sensed property by comparing charging time between the two paths and adjusting the charging rate of one of the two paths by increasing or decreasing the amount of capacitance in that path, until both of the two paths have the same charging time to reach the first and second reference voltages or currents. A digital output represents a value of the capacitance. Digital feedback resets the converter to restart the charging time.

A method for charging to digital converter sensing in a CMOS integrated circuit generates two ramp voltages or currents by charging two on-chip capacitors with a sub nanowatt current reference generator. The method compares, on-chip, a first of the two ramp voltages or currents to a constant with sensed property voltage or current and a second of the ramp voltages or currents with proportional to sensed property voltage or current. The method directly digitizes, on-chip, a charging time comparison of the two ramp voltages or currents to provide a sensed value.

DESCRIPTION OF THE PREFERRED EMBODIMENTS

Present circuits provide even better conversion and sensing accuracy, for example, an improved temperature inaccuracy and an LSB-first feedback algorithm for 670× improved conversion time at negligible power overhead compared to the state-of-the-art in Mercier et al. PCT Publication WO2018217754. Preferred embodiments provide sub 1 V and sub-nW (pico Watt in a preferred embodiment)temperature-to-digital converter that improves both accuracy and conversion time compared to that state-of-the-art design.

An example sensor of the invention was fabricated in 65 nm CMOS and measurement from 8 samples reveal a maximum temperature error of +/−1.38° C. (+/−0.73° C.) and +0.77/−0.41° C. when operating from 0 to 100° C. after two-point (three-point) calibration without and with trimming, respectively. Operating from a 0.5 V supply, the 8 samples consumed an average power of 763 pW at 20° C., which after a 0.3 s conversion time results in 230 pJ/conversion.

Preferred embodiments provide converters, sensing methods and sensors that demand near zero energy to operate. Example circuits use two ramp voltages $V_{ramp,top}$ and $V_{ramp,bot}$ that are generated by charging two on-chip metal-insulator-metal (MIM) capacitors $C_{top}$ and $C_{bot}$ with an ultra-low (sub nanowatt) power current reference generator. These two ramp voltages are then compared to a constant with temperature (CWT) voltage and a proportional to absolute temperature (PTAT) voltage, respectively. A change that corresponds to temperature is then directly digitized by matching the charging time between $V_{ramp,top}$ and $V_{ramp,bot}$ via digital feedback tuning of $C_{top}$ driven by an energy-efficient digital processing unit which employs LSB-first algorithm. The CWT path is used as reference to digitize the PTAT path, which results in a digitization of the difference in charging time caused by temperature change in the PTAT path. Artisans will appreciate that other sensed properties can be digitized, e.g., pressure, humidity, strain, etc. Any sensed property that can be converted to a voltage or current can be digitized, e.g. pressure.

Preferred embodiments of the invention will now be discussed with respect to experiments and drawings. Broader aspects of the invention will be understood by artisans in view of the general knowledge in the art and the description of the experiments that follows.

Figure 1A:
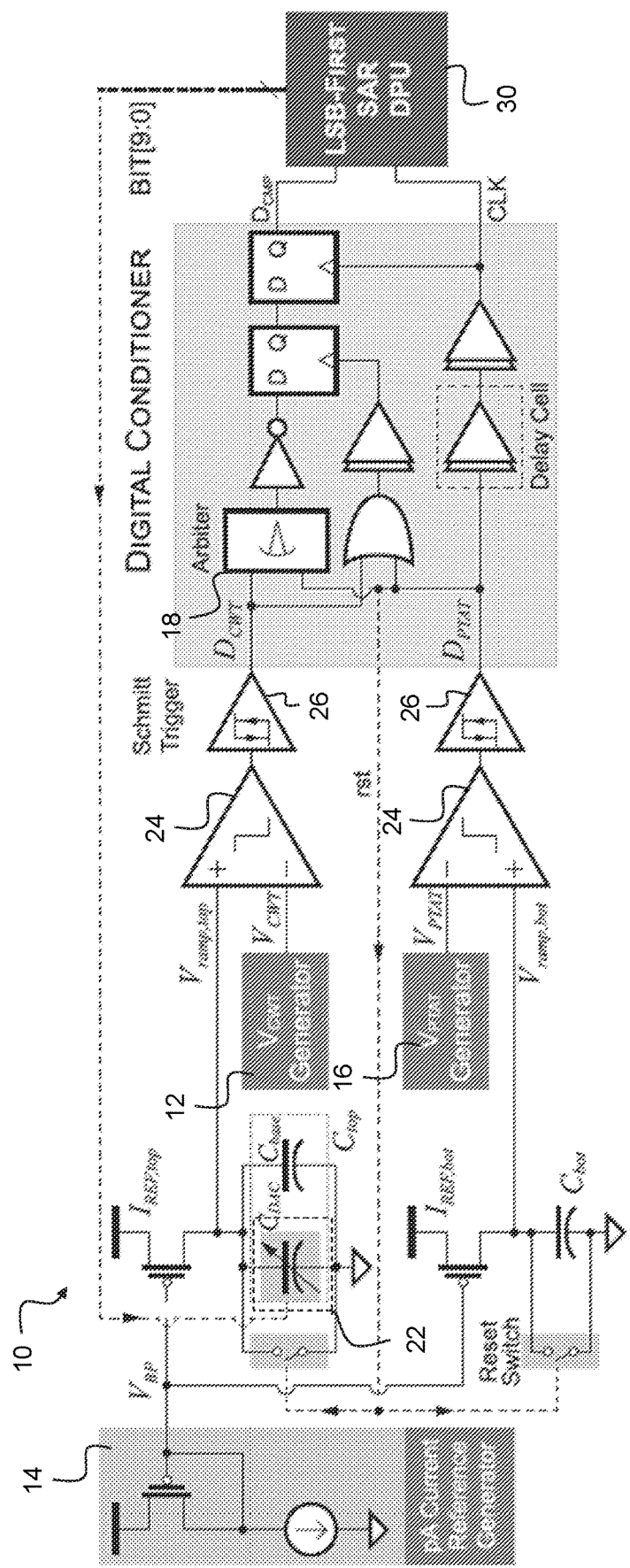
FIG. 1A is a block diagram and FIGS. 1B-E schematic diagrams of a preferred embodiment temperature-to-digital converter of the invention.

FIG. 1A is a block diagram of a preferred embodiment temperature-to-digital converter 10. FIGS. 1B-1E are respective schematic diagrams of a preferred $V_{CWT}$ generator 12, a pA reference current generator 14, a $V_{PTAT}$ generator 16, and an arbiter 18. The preferred converter 10 uses the single pA reference current generator 14, generated by biasing a gate-leakage device with the 3T CWT $V_{CWT}$ generator 12 (VRG) consisting of an OFF-state PMOS, $M_{1,CWT}$ (nominal W/L=7.2/19 µm, tunable from 0.9/19 µm to 14.4/19 µm), on top of a diode-connected NMOS, $M_{2,CWT}$ (W/L=3/2 µm), with a third NMOS, $M_{R,CWT}$ (W/L=2/3 µm), in OFF state for improved line regulation] via the pW-level feed-back architecture of the pA reference current generator 14 in FIG. 1C, where a gate-leakage transistor 20 is employed to serve as a large resistor and mirrors current in the leakage transistor to charge a fixed capacitor, $C_{bot}$ (with ramp voltage $V_{ramp,bot}$), a 10-bit capacitive DAC 22, $C_{top}$ (with ramp voltage $V_{ramp,top}$), and thus, unlike Mercier et al. PCT Publication WO2018217754, any temperature-dependent current source non linearities appear as a common mode and are rejected. Thus, instead of temperature modulating currents, the ramp voltages of the two capacitors $C_{bot}$ and $C_{top}$ are directly compared to the output of the $V_{CWT}$ 12 and $V_{PTAT}$ generator 16, respectively, which effectively serve as the temperature transducer. Current can also be used as a comparison instead of voltage, and any sensed property that can be converted to a voltage or current can be used in place of the $V_{PTAT}$ generator 16. As shown in FIG. 1D, the $V_{PTAT}$ generator 16 consists of a PTAT core implemented by two NMOSs of the same type, e.g., high-threshold NMOSs $M_{1,PTAT}$ (nominal W/L=12.8/0.28 µm, tunable from 1.6/0.28 µm to 25.6/0.28 µm) and $M_{2,PTAT}$ (W/L=0.4/0.28 µm), and a third OFF-state NMOS $M_{R,PTAT}$ (W/L=3/1 µm) serving as a line regulator. Two pairs of comparators 24 and Schmitt triggers 26 transduce the corresponding charging-time information into digital domain with a delay contributing less than 2% of decision aperture variation across 0° C. to 100° C. A digital conditioner consisting of the arbiter 18 then determines which ramp voltage $V_{ramp,top}$, $V_{ramp,bottom}$ crossed its respective threshold $V_{CWT}, V_{PTAT}$ first and at which point the capacitors are reset through an LSB-first logic digital processing unit (DPU) 30. $C_{top}$ is thus digitally adjusted until the charging times are equalized in subsequent cycles when $C_{top}$ can be calculated by $$C_{top} = \frac{V_{PTAT} I_{REF,top} C_{bot}}{V_{CWT} I_{REF,bot}} \quad (1)$$

where $I_{REF,top}$ and $I_{REF,bot}$ are the currents mirrored from the pA-level current reference generator to charge $C_{top}$ and $C_{bot}$, respectively. Ignoring the higher order nonlinear components and thus, for simplicity, assuming:

$$V_{PTAT} = k_{1,p} T + V_{o,p} \quad (2)$$

where $k_{1,p}$ is the temperature coefficient of $V_{PTAT}$ and $V_{o,p}$ represents an offset, (1) can be rewritten as $$C_{top} = k_{1,p} T \frac{I_{REF,top} C_{bot}}{V_{CWT} I_{REF,bot}} + V_{o,p} \frac{I_{REF,top} C_{bot}}{V_{CWT} I_{REF,bot}} \quad (3)$$

where the first term on the right-hand side of (3) represents a proportional to temperature component and the latter is a temperature-independent offset term. As shown in FIG. 1A, $C_{top}$ is composed of $C_{DAC}$ and $C_{base}$ that can be calculated by (4) and (5), respectively $$C_{DAC} = k_{1,p} T \frac{I_{REF,top} C_{bot}}{V_{CWT} I_{REF,bot}} \quad (4)$$

$$C_{base} = V_{o,p} \frac{I_{REF,top} C_{bot}}{V_{CWT} I_{REF,bot}}. \quad (5)$$

Therefore, the size of $C_{DAC}$ is proportional to temperature, thus creating a direct 10-bit readout, while the latter, $C_{base}$, sets the temperature-to-code mapping range. In an experimental prototype implementation, $C_{bot}$ is 4.8 pF. $C_{base}$ is implemented with a tuning resolution of 9.47 fF up to a maximum size of 19.4 pF and the unit capacitance of $C_{DAC}$ is 9.47 ff.

Figure 2:
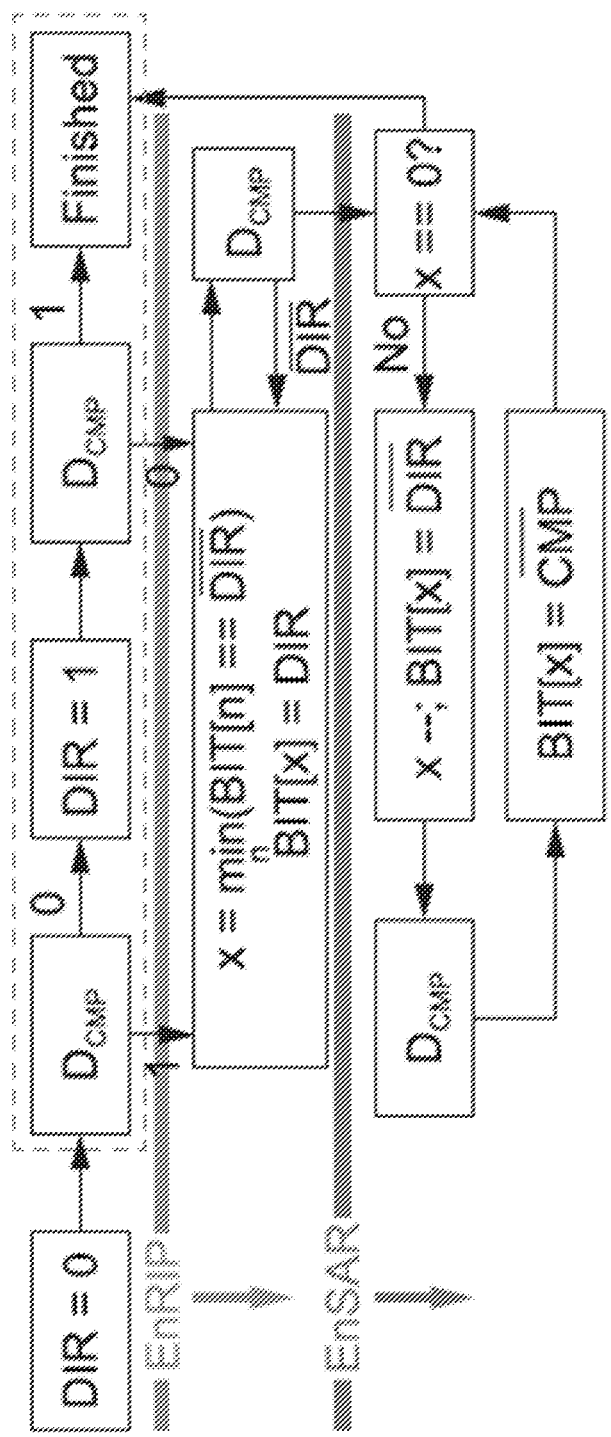
FIG. 2 is a flowchart of operations performed by LSB-first SAR Digital Processing Unit (DPU) of the preferred FIG. 1A temperature sensor.

Instead of a conventional successive approximation register (SAR) logic which updates the approximation of an input based on a binary search algorithm successively from most significant bit (MSB) to LSB, the preferred embodiment uses FIG. 2 logic such that LSB-first SAR logic updates from the LSB to MSB and determines the effective MSB for each conversion, MSBconv, followed by a conventional SAR conversion that proceeds from MSBconv, rather than the actual MSB bit, dynamically adjusting the length of the SAR logic that is necessary for each conversion and thus digitizing low activity signals more efficiently. FIG. 2 shows the flowchart of the LSB-first SAR logic employed in the digital processing unit (DPU) 30 of the preferred temperature sensor, assuring fast and efficient temperature-to-digital conversion. Except for the best-case single-cycle search, the LSB-first SAR algorithm operates in two phases. In phase 1, the bit that is not equal to DIR (the initial arbiter output) is set to DIR, with those equal to DIR skipped from LSB to MSB in each clock cycle until BIT[m] that causes the output of the arbiter to flip and thus MSBconv=BIT[m] for this conversion. At the same time, the logic enters phase 2, and a regular SAR algorithm is applied from MSBconv (BIT[m]) to the LSB. Under small cycle-to-cycle temperature changes, m<<9 in the 10-bit readout and the converter can settle in as little as a single clock cycle when MSBconv=BIT[0]. At ambient room temperature, an average of 1.3 cycles is required. In the worst case, up to 20 clock cycles are required, which is still over 51× faster than the linear-search algorithm employed in the state-of-the art described in H. Wang and P. P. Mercier, "Near-zero-power temperature sensing via tunneling currents through complementary metal-oxide-semiconductor transistors," Sci. Rep., vol. 7, Art. no. 4427, June 2017. A conventional SAR can also be used, however, that will reduce the conversion speed.

Figures 3A, 3B:
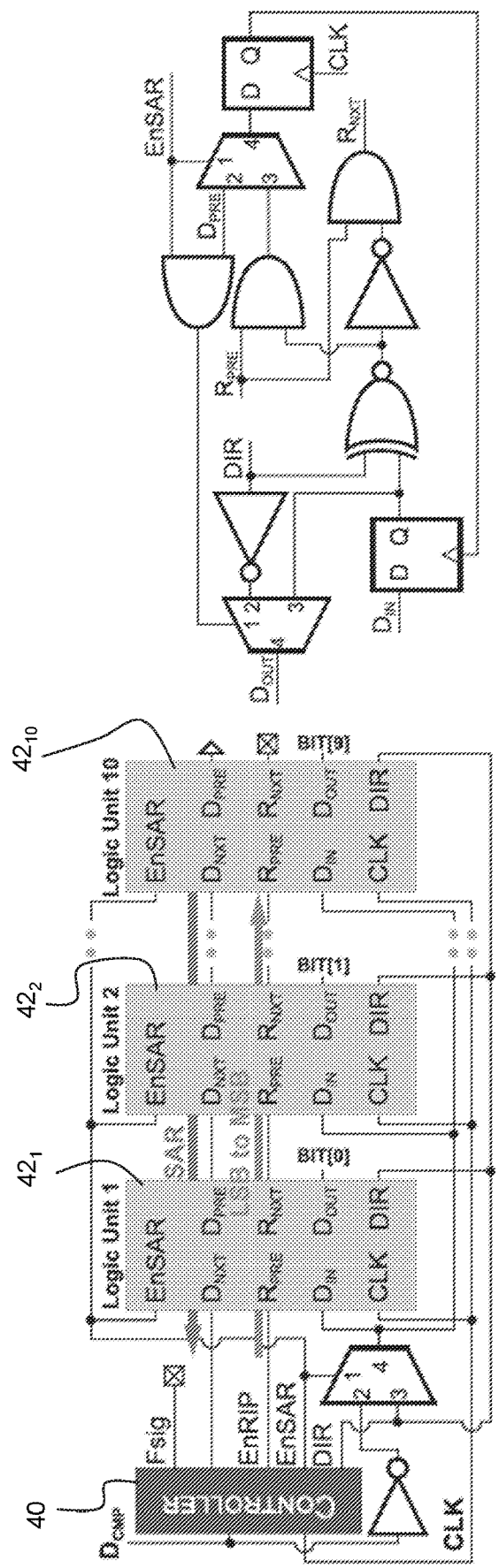
FIG. 3A is a block diagram of the DPU of the preferred FIG. 1A temperature sensor and FIG. 3B is a schematic diagram of the logic units in FIG. 3A.

The LSB-first DPU block diagram is shown in FIG. 3A and FIG. 3B the preferred schematic diagram for its logic units, where a controller 40 is employed to transition the DPU 30 between the LSB-to-MSB phase (EnRIP) and the SAR phase (EnSAR) based on the decision of the arbiter 18 in each clock cycle. Ten logic units $42_1$-$42_{10}$ are then employed to generate digital bits (BIT[9:0]) that adjust the size of $C_{DAC}$ based on the comparator (24 in FIG. 1A) output $D_{CMP}$ (in the SAR phase) or DIR (in the LSB-first phase) and the outputs of the preceding stage ($D_{PRE}$ or $R_{PRE}$). The logic unit then sends outputs $D_{OUT}$ or $R_{NXT}$ to the following stage in each clock period in the direction determined by the controller during conversion. BIT[9:0] are then readily available at the end of each temperature conversion for direct digital readout.

Figure 4:
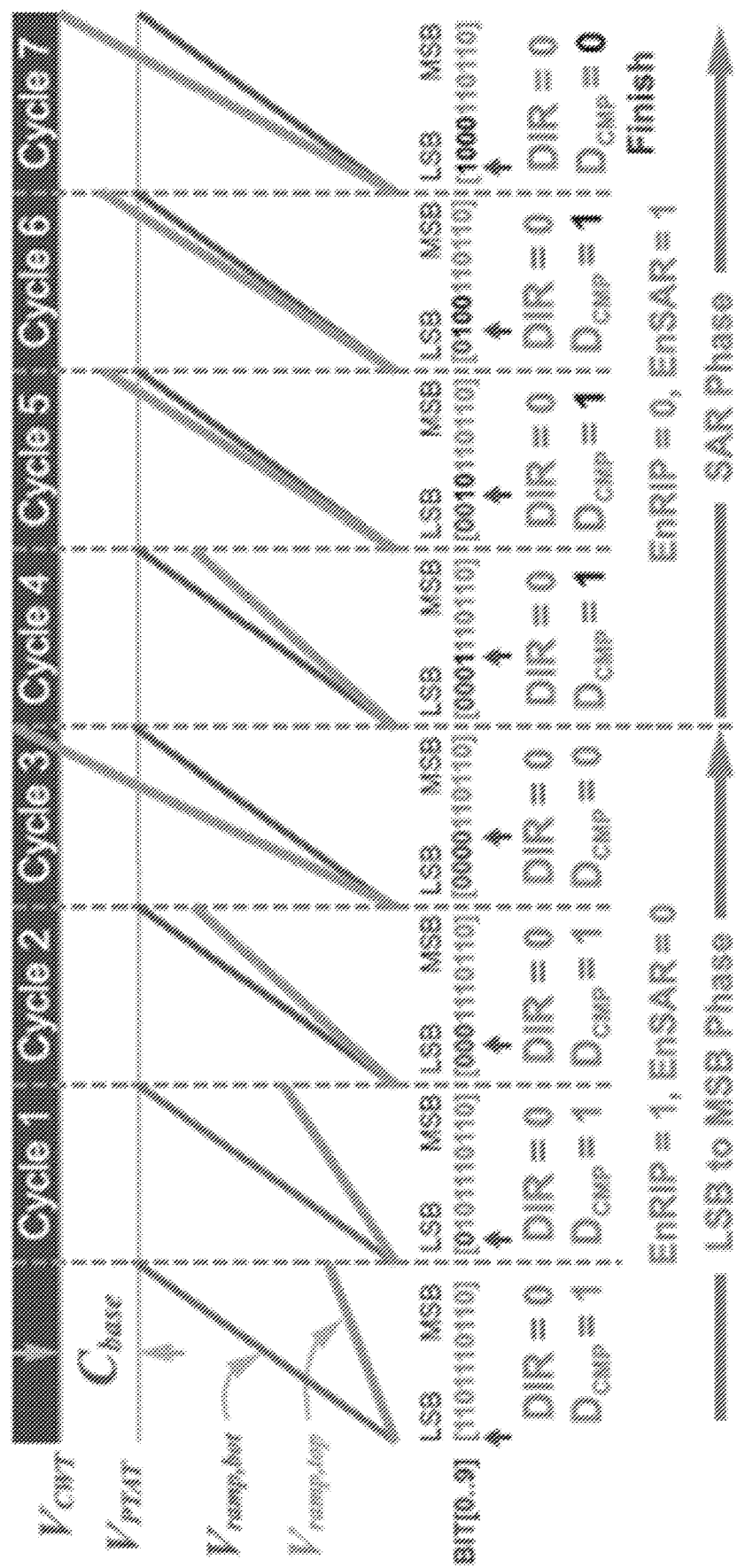
FIG. 4 shows an example waveform of several consecutive operations during one conversion period of the preferred FIG. 1A temperature sensor.

FIG. 4 shows an example waveform of several consecutive operations during one conversion period. Assuming initially $V_{ramp,top}$ ramps slow and cannot reach $V_{CWT}$ within one clock cycle that is defined by $V_{ramp,bot}$ and $V_{PTAT}$, the temperature sensor enters the LSB-to-MSB phase by setting the bits that are not equal to DIR, i.e. "0," from LSB o MSB, effectively decrementing $C_{DAC}$. BIT[2] is skipped as indicated from Cycle 2 to Cycle 3 since BIT[2]=DIR. SAR searching begins when $D_{CMP}$ flips at Cycle 4 (from "0" to "1" and thus MSBconv=BIT[3]) starting from BIT[3] to BIT[0] until one conversion is complete.

Figures 5A, 5B:
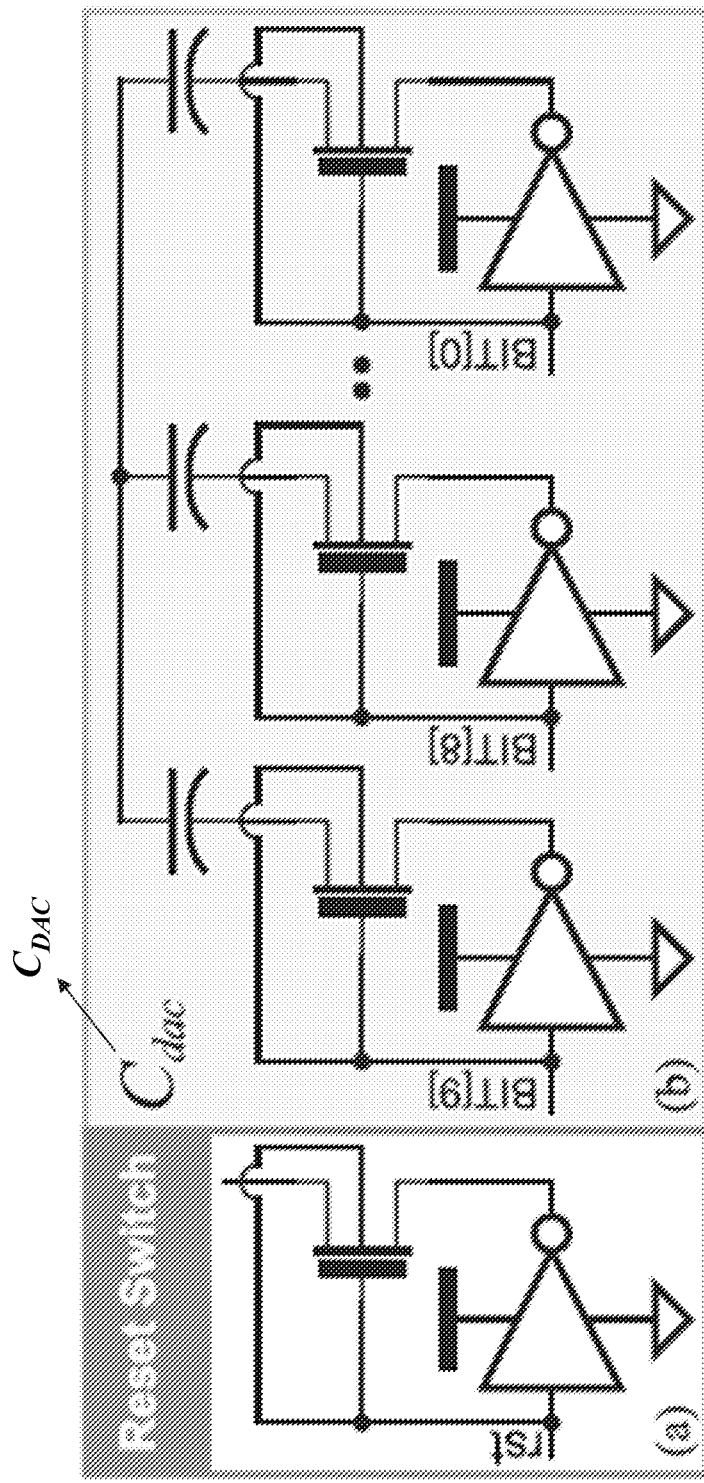
FIGS. 5A and 5B is a schematics of a preferred super cut-off switch for transistors in the voltage reference generators (VRG) employing A (A) dynamic threshold voltage MOSFET and A (b) DAC (digital-to-analog converter)

The CWT and PTAT VRGs are preferably constructed with self-regulated transistor structures [29], with transistor $M_1$ digitally tunable (4 bit) to combat nonidealities such as parasitic diode leakage and process variation [H. Wang and P. P. Mercier, "A 420 fW self-regulated 3T voltage reference generator achieving 0.47%/V line regulation from 0.4-to-1.2 V," in Proc. 43rd IEEE Eur. Solid State Circuits Conf. (ESSCIRC), September 2017, pp. 15-18] for improved linearity and thus minimized temperature sensing error. Since all circuits in the preferred embodiment operate in the pA-regime, leakage across switches can become significant and deteriorate performance. To minimize leakage, dynamic threshold MOS transistors (DTMOS) [F. Assaderaghi, D. Sinitsky, S. A. Parke, J. Bokor, P. K. Ko, and C. Hu, "Dynamic threshold-voltage MOSFET (DTMOS) for ultra-low voltage VLSI," IEEE Trans. Electron Devices, vol. 44, no. 3, pp. 414-422, March 1997] are preferably used with super cutoff control by employing an inverter in FIG. 5A to set the source of NMOS switches at $V_{DD}$, and thus $V_{gs}$ of the switch is smaller than 0 during OFF-state, effectively reducing the $R_{on}/R_{off}$ ratio by over 32× when VDD=0.5 V. Such switches are utilized to reset $C_{top}$ and $C_{bot}$ in FIG. 1A, as well as in the DAC shown in FIG. 5B (DAC 22 of FIG. 1A), which improves its linearity by 5× with a power overhead less than 2.2 pW per switch. $C_{top}$ ($C_{DAC}$) consists of an array of capacitors as shown in FIG. 5B. The feedback decides which of the capacitors in the array is selected and connected to the loop/circuit through switches (this process can also be referred to as tuning) via the control bits (BIT[9] to BIT[0] in FIG. 5B). And in this way, the temperature information is digitized as the control bits (BIT[9] to BIT[0] in FIG. 5B).

Temperature-to-Digital Conversion

Across the temperature range from $T_{min}$ to $T_{max}$, the mini-mum and maximum $C_{DAC}$ can be calculated by the following:

$$C_{DAC,min} = k_{1,p} T_{min} \frac{I_{REF,top} C_{bot}}{V_{CWT} I_{REF,bot}} \quad (6)$$

$$C_{DAC,max} = k_{1,p} T_{max} \frac{I_{REF,top} C_{bot}}{V_{CWT} I_{REF,bot}}. \quad (7)$$

Therefore, the temperature-to-digital conversion resolution, $T_{LSB}$, can be calculated by $$T_{LSB} = \frac{T_{max} - T_{min}}{C_{DAC,max} - C_{DAC,min}} = \frac{V_{CWT} I_{REF,bot}}{k_{1,p} I_{REF,top} C_{bot}}. \quad (8)$$

A smaller $V_{CWT}$ to $k_{1,p}$ ratio compared to the ratio of $I_{CWT}$ to $k_{IPTAT}$ (the temperature coefficient of PTAT current $-k_{IPTAT}$ which is $$k_{IPTAT} = \frac{\partial I_{PTAT}}{\partial T},$$

where $I_{PTAT}$ is the PTAT current) . . . ) enables higher temperature-to-digital conversion resolution. In addition, $V_{CWT}$ is easier to generate and calibrate and is more linear than a PTAT current. Moreover, one more design freedom is preferably provided to control the temperature-to-digital conversion resolution by adjusting the two mirrored currents $I_{REF,top}$ and $I_{REF,bot}$ by simply using different mirroring transistor sizes. In this implementation, $I_{REF,top}$ is designed to be 4× of $I_{REF,bot}$ to increase the temperature-to-digital conversion resolution with moderate increase of the chip area as indicated by (6) and (7).

Temperature Error Analysis

As indicated by (1), the temperature conversion error due to nonlinearity of the proposed temperature sensor is primarily contributed by the nonideal PTAT and CWT reference voltage ($V_{PTAT}$ and $V_{CWT}$), current reference generators ($I_{REF,top}$ and $I_{REF,bot}$), and the nonlinearity of $C_{DAC}$. In the following analysis of error in measurement, the nonideal components are analyzed independently, i.e., the other parameters are assumed to be ideal while one parameter is under analysis.

$V_{PTAT}$-Induced Temperature Error: To quantify the impact of nonideality of $V_{PTAT}$ on the system linearity, instead of (2), $V_{PTAT}$ can be represented by its Taylor series to include its higher order nonlinear components:

$$V_{PTAT} = k_{1,p}T + k_{2,p}T^2 + \ldots + k_{n,p}T^n + V_{o,p} \tag{9}$$

where $k_{2,p}$ to $k_{n,p}$ are the coefficients of the second-to-nth-order nonlinear components of $V_{PTAT}$. Thus, (1) can be rewritten as $$C_{top} = \tag{10}$$
$$(k_{1,p}T + k_{2,p}T^2 + \ldots k_{n,p}T^n)\frac{I_{REF,top}C_{bot}}{V_{CWT}I_{REF,bot}} + V_{o,p}\frac{I_{REF,top}C_{bot}}{V_{CWT}I_{REF,bot}}②.$$

As shown in (10), the proportional to temperature component, $C_{DAC,p}$, can now be calculated by:

$$C_{DAC,p} = (k_{1,p}T + k_{2,p}T^2 + \ldots + k_{n,p}T^n)\frac{I_{REF,top}C_{bot}}{V_{CWT}I_{REF,bot}} \tag{11}$$

while the temperature-independent offset term ② is the same as (5). The temperature error due to $V_{PTAT}$ can be estimated by the corresponding induced temperature error at temperature T, $\epsilon_{V_{PTAT}}$ in the following equation:

$$\epsilon_{V_{PTAT},T} = \frac{(C_{DAC,p} - C_{DAC})(T_{max} - T_{min})}{C_{DAC,max} - C_{DAC,min}} = \frac{k_{2,p}T^2 + \ldots + k_{n,p}T^n}{k_{1,p}}. \tag{12}$$

$V_{CWT}$-Induced Temperature Error: Similarly, the nonlinear $V_{CWT}$ can be calculated by the Taylor series in the following equation:

$$V_{CWT} = k_{1,c}T + k_{2,c}T^2 + \ldots + k_{n,c}T^n + V_{o,c} \tag{13}$$

where $k_{1,c}$ to $k_{n,c}$ are the coefficients of the first-to-nth-order nonlinear components and $V_{o,c}$ is the CWT component of $V_{CWT}$. As a result, $C_{top}$ can now be recalculated by $$C_{top} = \frac{(k_{1,p}T + V_{o,p})I_{REF,top}C_{bot}}{(k_{1,c}T + k_{2,c}T^2 + \ldots k_{n,c}T^n + V_{o,c})I_{REF,bot}}. \tag{14}$$

$V_{o,c} \ll k_{1,c}T + k_{2,c}T^2 + \ldots + k_{n,c}T^n$ for $V_{CWT}$, (14) can be approximated by $$C_{top} \approx \left[1 - \frac{k_{1,c}T + k_{2,c}T^2 + \ldots + k_{n,c}T^n}{V_{o,c}}\right] \times \tag{15}$$
$$\frac{(k_{1,p}T + V_{o,p})I_{REF,top}C_{bot}}{V_{o,c}I_{REF,bot}}.$$

Therefore, the proportional to temperature portion of $C_{top}$, $C_{DAC}, V_{CWT}$ can be calculated by the following equation:

$$C_{DAC,c} = \left[k_{1,p}T - \frac{k_{1,c}T + k_{2,c}T^2 + \ldots + k_{n,c}T^n}{V_{o,c}} \times (k_{1,p}T + V_{o,p})\right] \tag{16}$$
$$\frac{I_{REF,top}C_{bot}}{V_{o,c}I_{REF,bot}}.$$

The corresponding $V_{CWT}$-induced temperature error can be represented by $\epsilon_{V_{PTAT},T}$ in the following equation:

$$\epsilon_{V_{CWT},T} = \frac{k_{1,c}T + k_{2,c}T^2 + \ldots + k_{n,c}T^n}{k_{1,p}V_{o,c}}(k_{1,p}T + V_{o,p}). \tag{17}$$

$I_{REF}$-Induced Temperature Error: As shown in FIG. 1A and as indicated by (1), reference currents $I_{REF,top}$ and $I_{REF,bot}$ are mirrored from the same current reference generator, and the temperature-dependent mismatch between $I_{REF,top}$ and $I_{REF,bot}$, which can calculated by (18), can degrade the nonlinearity of the overall system.

$$\frac{I_{REF,top}}{I_{REF,bot}} = r_0 + r_1T + r_2T^2 + \ldots + r_nT^n \tag{18}$$

where $r_0$ is the temperature-independent $I_{REF,top}$ to $I_{REF,bot}$ ratio and $r_1$ to $r_n$ are the first-to-$n^{th}$ order of nonlinearity coefficients of $I_{REF,top}$ to $I_{REF,bot}$ ratio. As a result, $C_{top}$ and its proportional to temperature component $C_{DAC,i}$ can be calculated by the following equations:

$$C_{top} = (r_0 + r_1T + \ldots + r_nT^n)\frac{(k_{1,p}T + V_{o,p})C_{bot}}{V_{CWT}} \tag{19}$$

$$C_{DAC,c} = (r_0 + r_1T + \ldots + r_nT^n)\frac{(k_{1,p}T + V_{o,p})C_{bot}}{V_{CWT}} + \tag{20}$$
$$(r_1T + \ldots + r_nT^n)\frac{V_{o,p}C_{bot}}{V_{CWT}}.$$

The corresponding temperature error introduced by the temperature-dependent mismatch between $I_{REF,top}$ and $I_{REF,bot}$ can be quantified by $$\epsilon_{I_{REF},T} = (r_1T + \ldots r_nT^n)\frac{(k_{1,p}T + V_{o,p})}{k_{1,p}r_0}. \tag{21}$$

$C_{DAC}$-Induced Temperature Error: In the preferred temperature sensor of FIG. 1A, $C_{DAC}$ is implemented by a metal-insulator-metal (MIM) capacitor and thus shows negligible temperature dependence (on the order of a few tens of ppm/° C.). However, the leakage in the switches and the mismatches between the LSB and MSB capacitors, which are effectively reflected as the nonlinearity of $C_{DAC}$, can exert significant impact on the temperature sensor's performance. For an N-bit $C_{DAC}$ with an integral nonlinearity (INL) of $INL_{CDAC}$ and a detectable temperature range of $T_{max}$-$T_{min}$, the nonlinearity of the temperature sensor caused by $C_{DAC}$ nonlinearity can be estimated by:

$$\epsilon_{C_{DAC}} = INL_{C_{DAC}} \frac{T_{max} - T_{min}}{2^N} \quad (22)$$

For example, a 10-bit $C_{DAC}$ covering a temperature range of 100° C. with an INL of $INL_{CDAC}=1$ LSB ensures a temperature error of 0.1° C. The simulated INL of the DAC is −0.25/0.39 LSB, thus ensuring a less than 0.1° C. DAC induced temperature error.

Figure 6:
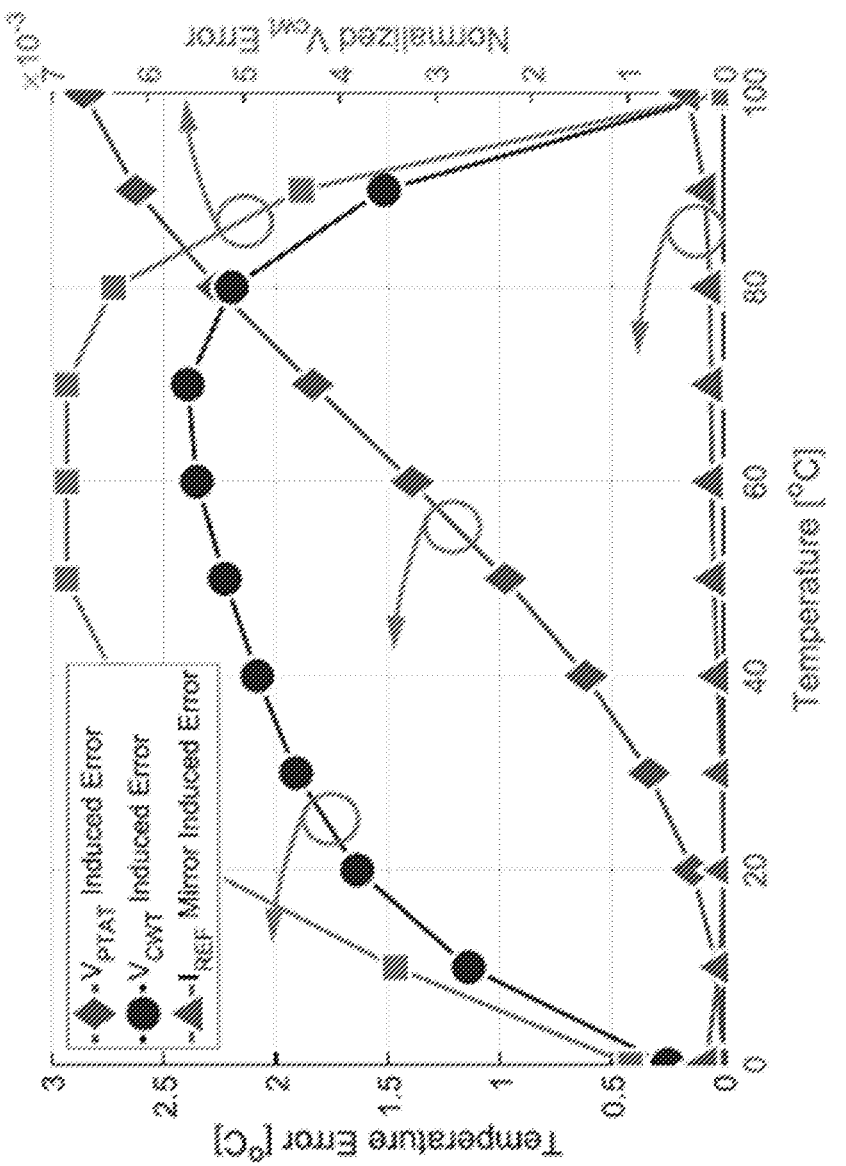
FIG. 6 is a plot of temperature error induced by $V_{PTAT}$, $V_{CWT}$, and the temperature-dependent mismatch between the mirrored current of $I_{REF}$ in FIG. 1A without calibration.

Error Evaluation: In FIG. 6, the temperature error induced by the nonlinearity of $V_{PTAT}$, $V_{CWT}$, and the temperature-dependent mismatch between the currents $I_{REF,top}$ and $I_{REF,bot}$ is calculated and plotted utilizing simulated temperature coefficients of $V_{PTAT}$ and $V_{CWT}$, and the ratio of $I_{REF,top}$ to $I_{REF,bot}$ without calibration. The temperature error introduced by the temperature-dependent mismatch of $I_{REF,top}$ to $I_{REF,bot}$ is negligible compared to those due to $V_{PTAT}$ and $V_{CWT}$ (<0.5° C.), which is in good accordance with the fact that the mismatch of $I_{REF,top}$ to $I_{REF,bot}$ is more of a function of process and corners rather than temperature. On the other hand, in order to achieve a low average temperature coefficient across the temperature range from 0° C. to 100° C., the $V_{CWT}$ generator is preferably constructed such that $V_{CWT}$ exhibits a variation over temperature, as shown in FIG. 6 (dashed line) when normalized. As indicated in FIG. 6, when operating at temperatures below 80° C., the systematic error is dominated by the temperature error induced by the nonlinearity of $V_{CWT}$. As shown in FIG. 6, $\epsilon_{V_{CWT,T}}$ exhibits a similar temperature profile as that of $V_{CWT}$ in good accordance with the fact that the temperature error is proportional to the temperature variation of $V_{CWT}$ as indicated by (8). At high temperatures (e.g., above 80° C.), the temperature error resulted from the non-linearity of $V_{PTAT}$ becomes prominent because: 1) the diode leakage that introduces the error is exponentially proportional to temperature and 2) the change of d operating point of the $V_{PTAT}$ generator [FIG. 1B] aggregates over temperature. For example, the head room of $M_{R,PTAT}$ and $M_{1,PTAT}$ is decreased by over 30 mV from 0° C. to 100° C. while that of $M_{2,PTAT}$ is increased by the same amount, which, in turn, introduces an extra change in diode leakage and error due to the body effect. Therefore, the size of the transistors $M_{1,CWT}$ in the $V_{CWT}$ generator [FIG. 1B] and $M_{1,PTAT}$ in the $V_{PTAT}$ generator [FIG. 1B] is each implemented with a 4-bit binary-weighted array to minimize the temperature error.

Fabricated Prototype. The temperature sensor of FIG. 1A was implemented in 65-nm CMOS, fully integrated within an area of 0.63 mm², including a serial peripheral interface (SPI) and test buffers. No external voltage or frequency reference was required for the sensor to function. Chip area was dominated by the area of $C_{base}$ (380×770 µm²), $C_{DAC}$ (360×350 µm²), and $C_{bot}$ (360×220 µm²), which collectively occupy 79% of the total area. The area was dominated by the available minimum unit capacitance, which can be scaled dramatically in advanced processes. In addition, for full system-on-chip (SoC) solutions, the area can be further minimized by placing the analog and digital blocks beneath the capacitors. A 0.5V source was used to simulate a low power energy harvesting device, and the fabricated prototype only consumed 763 pW at 20° C., while consuming less than 75 nW across the temperature range from 0° C. to 100° C. In practice, the available power source can be an energy harvesting device or a battery. The integrated digital converters of the invention relax the requirement of the energy harvesting device and provide additional advantages. For example, a low volume energy harvesting device can be used to implement the whole system in a small form factor. After two-point calibration at 20° C. and 70° C., a maximum temperature error of +1.61° C./−1.53° C. was observed across a 0° C. to 100° C. range, while a temperature error of +0.86° C./−0.83° C. was achieved with a three-point calibration. A temperature resolution of 0.3° C. was obtained with a conversion time of 0.3 s at room temperature, resulting in a conversion energy of 0.23 nJ/conversion, believed by the inventors to be the lowest reported conversion energy of a fully integrated sub-µW temperature sensor at the time of the invention, while also achieving improved inaccuracy compared to sub 100 nW designs. A resolution of 0.1° C. was achieved when operating at a conversion time above 0.9 s. Measurements across twelve 65-nm samples revealed a maximum temperature error of +1.61° C./−1.53° C. across the temperature range from 0° C. to 100° C. after two-point calibration, which can be reduced to +0.86° C./−0.83° C. after three-point calibration or +0.81° C./−0.75° C. after two-point calibration with trimming, all with an average power consumption of 763 pW.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:
1. A charging to digital converter sensor in a CMOS integrated circuit, the sensor comprising:
  a voltage or current reference generator that generates a first reference voltage or current that is constant with respect to a sensed property;
  a voltage or current reference generator that generates a second reference voltage or current that varies with respect to the sensed property;
  two paths including on-chip capacitors charged with a sub nanowatt current reference such that a first ramp voltage or current is generated in one of the two paths and a second ramp voltage or current is generated in a second of the two paths, wherein the first ramp voltage or current is compared to the first reference voltage or current and the second ramp voltage or current is compared to the second reference voltage or current;
  a digitizer for digitizing the sensed property by comparing charging time between the two paths and adjusting the charging rate of one of the two paths by increasing or decreasing the amount of capacitance in that path, until both of the two paths have the same charging time to reach the first and second reference voltages or currents, respectively, wherein a digital output represents a value of the capacitance; and
  digital feedback to reset the converter to restart the charging time.

2. The circuit of claim 1, wherein the sub nanowatt current reference is generated by biasing a gate leakage device with a three-transistor constant with sensed property voltage or current reference generator.

3. The sensor of claim 1, wherein the sub nanowatt current reference comprises a picoamp current reference that is a gate leakage transistor biased by a voltage reference generator.

4. The sensor of claim 3, wherein the voltage or current reference generators comprise voltage reference generators and consist of an OFF-state PMOS on top of a diode-connected NMOS and another NMOS in an OFF state.

5. The sensor of claim 4, wherein the sub nanowatt current reference comprises a gate-leakage transistor as a large resistor and mirrors current in the leakage transistor.

6. The sensor of claim 1, wherein the digital feedback comprises a binary search algorithm the searches successively from most significant bit (MSB) to least significant bit (LSB).

7. The sensor of claim 1, wherein the digital feedback comprises a LSB-first successive approximation register (SAR) that updates from the LSB to MSB and determines the effective MSB for each conversion, followed by an SAR conversion that dynamically adjusts the length of the SAR logic that is necessary for each conversion.

8. The sensor of claim 1, wherein the sensed property is temperature and the sub nanowatt current reference consists of a single constant with temperature current reference.

9. A method for charging to digital converter sensing in a CMOS integrated circuit, the method comprising:
generating two ramp voltages or currents by charging two on-chip capacitors with a sub nanowatt current reference generator;
comparing, on-chip, a first of the two ramp voltages or currents to a constant with sensed property voltage or current and a second of the ramp voltages or currents with proportional to sensed property voltage or current; and
directly digitizing, on-chip, a charging time comparison of the two ramp voltages or currents to provide a sensed value.

10. The method of claim 9, wherein the sensed value is temperature.

11. The method of claim 9, wherein the on-chip capacitors comprise metal-insulator-metal (MIM) capacitor.

* * * * *